(12) United States Patent
Juengling

(10) Patent No.: US 8,501,607 B1
(45) Date of Patent: Aug. 6, 2013

(54) FINFET ALIGNMENT STRUCTURES USING A DOUBLE TRENCH FLOW

(71) Applicant: Werner Juengling, Saratoga Springs, NY (US)

(72) Inventor: Werner Juengling, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/670,880

(22) Filed: Nov. 7, 2012

(51) Int. Cl.
*H01L 21/3205* (2006.01)

(52) U.S. Cl.
USPC ........... 438/587; 438/589; 438/696; 438/700; 438/702; 438/703; 438/758; 438/759; 438/778

(58) Field of Classification Search
USPC ................. 438/587, 589, 696, 700, 702, 703, 438/758, 759, 778
See application file for complete search history.

(56) References Cited

U.S. PATENT DOCUMENTS

| 7,863,136 | B2 * | 1/2011 | Goldbach et al. | 438/270 |
| 7,960,287 | B2 * | 6/2011 | Johnson et al. | 438/703 |
| 8,048,813 | B2 * | 11/2011 | Lai et al. | 438/736 |
| 8,309,427 | B2 * | 11/2012 | Fishburn et al. | 438/430 |
| 2007/0161251 | A1 * | 7/2007 | Tran et al. | 438/725 |

* cited by examiner

*Primary Examiner* — Thanh V Pham
(74) *Attorney, Agent, or Firm* — Ditthavong Mori & Steiner, P.C.

(57) ABSTRACT

A method is provided for forming FinFETS with improved alignment features. Embodiments include forming on a Si substrate pillars of TEOS on poly-Si; conformally depositing a first TEOS liner over the entire substrate; etching the first TEOS liner and substrate through the pillars, forming first trenches; filling the first trenches and spaces between the pillars with an oxide; removing the TEOS from the pillars and the oxide therebetween; removing the poly-Si; conformally depositing a second TEOS liner over the entire Si substrate; etching the second TEOS liner and Si between the oxide, forming second trenches having a larger depth than the first trenches; filling the second trenches with oxide; removing the oxide and the first and second TEOS liners down to an upper surface of the Si substrate; and recessing the oxide below the upper surface of the Si substrate.

17 Claims, 25 Drawing Sheets

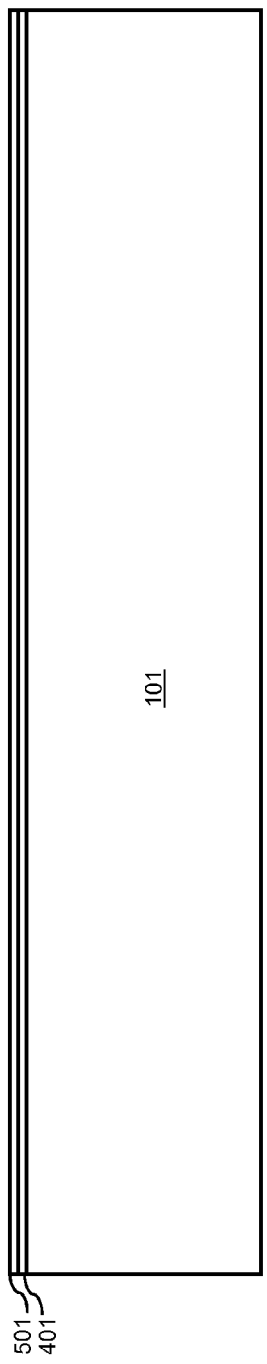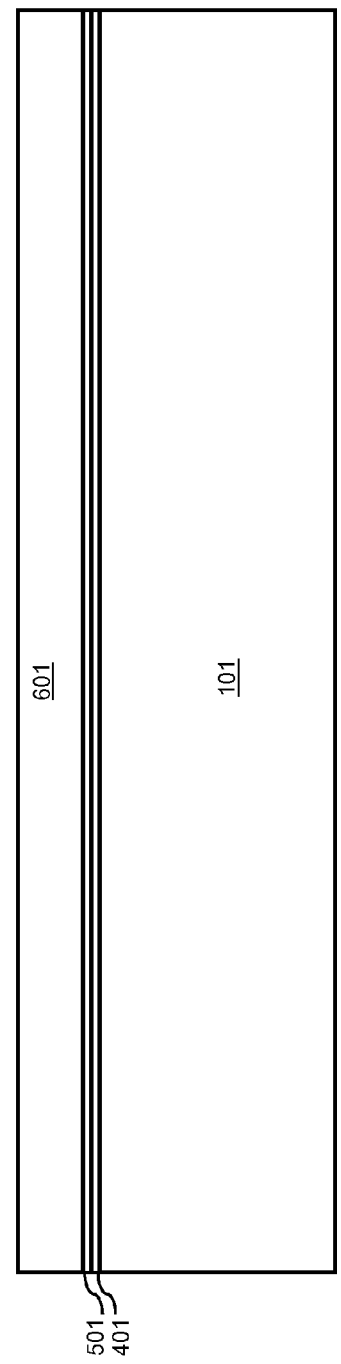

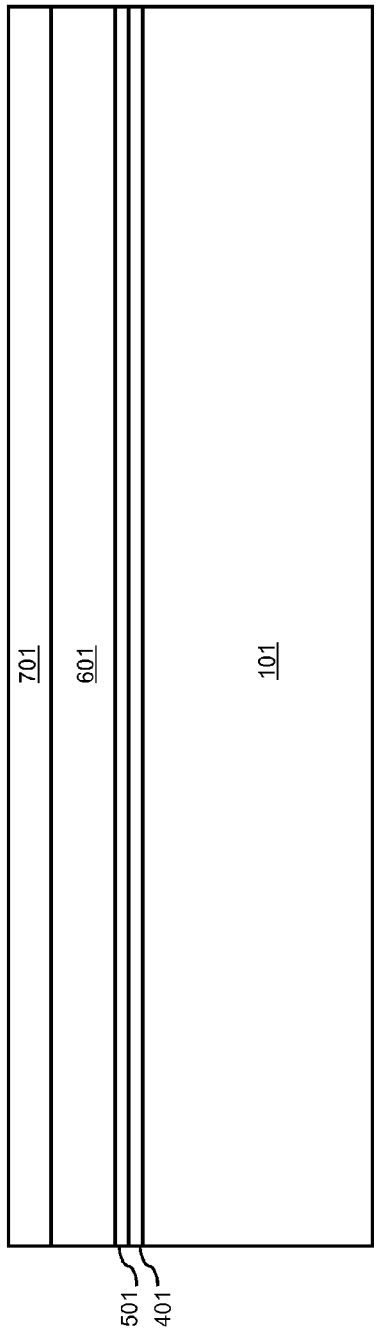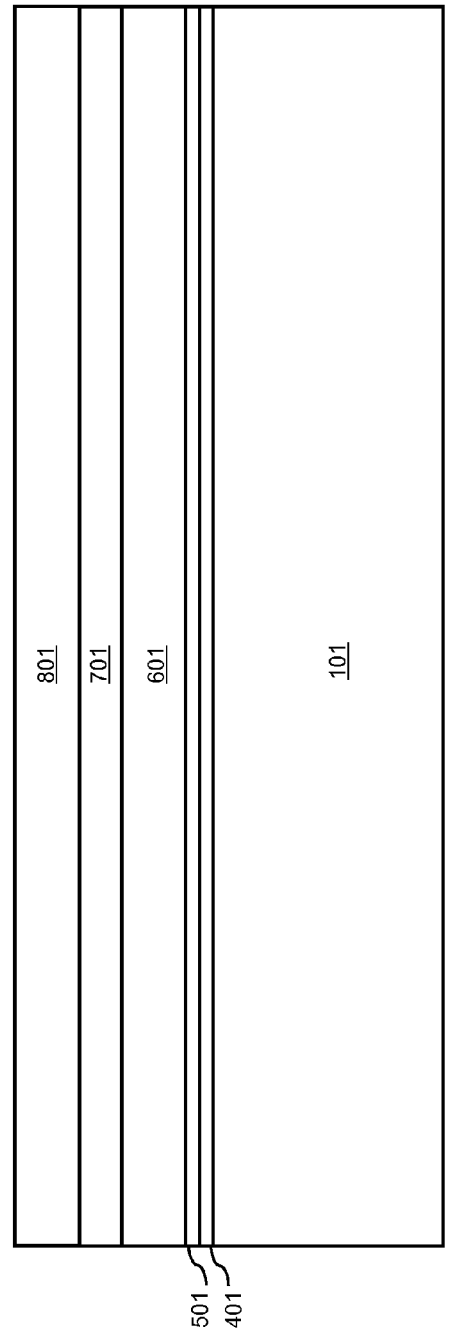

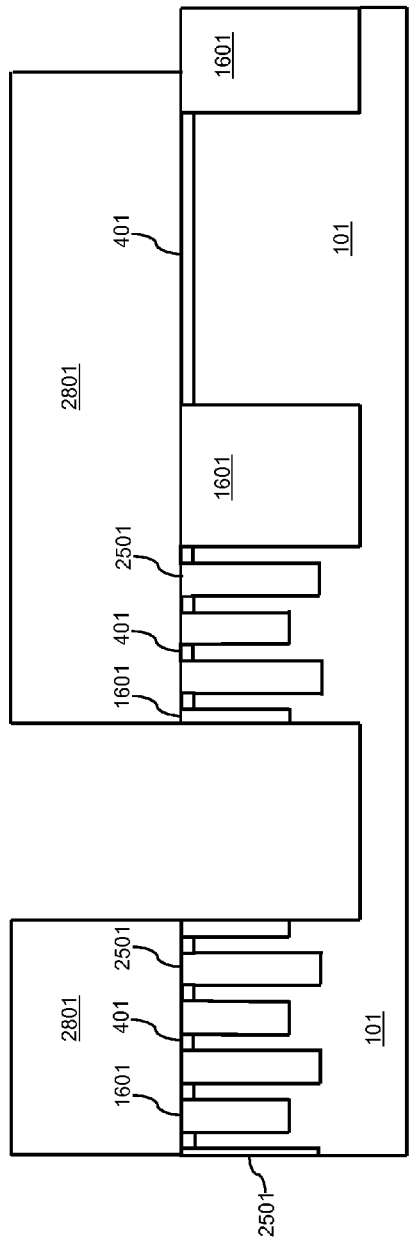
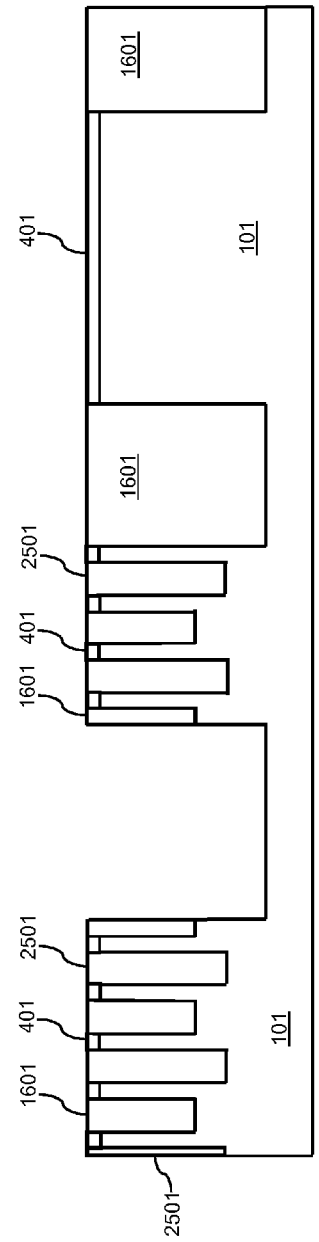

FINFET ALIGNMENT STRUCTURES USING A DOUBLE TRENCH FLOW

TECHNICAL FIELD

The present disclosure relates to semiconductor devices with alignment features. The present disclosure is particularly applicable in fabricating FinFETS.

BACKGROUND

During the processing of semiconductor devices, alignment structures, e.g., scribe line marks (SLMs), utilize a vertical step in a silicon wafer to obtain the location of an alignment structure and to align it to a stepper/scanner. However, obtaining the location of the alignment structure in conventional FinFET structures, having a single trench, is difficult because the conventional FinFET process leaves either a "sea-of-fins" or a deep trench. As a result, the stepper/scanner has difficulty recognizing the alignment structure as it requires large areas with different silicon heights.

A need therefore exists for methodology for fabricating semiconductor devices with improved alignment features, and the resulting device.

SUMMARY

An aspect of the present disclosure is a method of fabricating FinFETS with trenches having different silicon (Si) depths.

Another aspect of the present disclosure is a device including silicon fins having trenches therebetween with different Si depths.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming pillars on a Si substrate, the pillars including tetraethyl orthosilicate (TEOS) on polysilicon (poly-Si); conformally depositing a first TEOS liner over the entire silicon substrate; etching the first TEOS liner and Si substrate through the pillars, forming first trenches; filling the first trenches and spaces between the pillars with an oxide; removing the TEOS from the pillars and the oxide therebetween; removing the poly-Si; conformally depositing a second TEOS liner over the entire Si substrate; etching the second TEOS liner and Si between the oxide, forming second trenches having a different depth than the first trenches; filling the second trenches with oxide; removing the oxide and the first and second TEOS liners down to an upper surface of the Si substrate; and recessing the oxide below the upper surface of the Si substrate.

Aspects of the present disclosure include forming an oxide layer and a nitride layer on the Si substrate prior to forming the pillars. Other aspects include forming the oxide layer to a thickness of 35 angstroms (Å) to 300 Å and forming the nitride layer to a thickness of 50 Å. Further aspects include forming the pillars by: sequentially forming a poly-Si layer, a TEOS layer, and a one layer planarization (OLP) layer on the Si substrate; forming a photomask on the OLP layer; sequentially etching the OLP layer, the TEOS layer, and the poly-Si through the photomask; and removing the photomask and OLP layer. Additional aspects include forming the poly-Si layer to a thickness of 500 Å to 2000 Å, forming the TEOS layer to a thickness of 300 Å to 2000 Å; and forming the OLP layer to a thickness of 300 Å to 2000 Å. Further aspects include etching the OLP layer, the TEOS layer, and the poly-Si layer by dry-etching. Another aspect includes depositing the first TEOS liner to a thickness of 30 Å to 600 Å. Other aspects include dry etching the first TEOS liner and the Si to a depth of 1000 Å to 5000 Å into the Si substrate. Additional aspects include filling the first and second trenches with a high aspect process (HARP) material. Another aspect includes removing the TEOS from the pillars and oxide therebetween by chemical mechanical polishing (CMP). Further aspects include removing the poly-Si by wet etching. Another aspect includes depositing the second TEOS liner to a thickness of 30 Å to 600 Å. Additional aspects include dry etching the second TEOS liner and the Si to a depth of 1000 Å to 5000 Å into the Si substrate. Other aspects include removing the oxide and the first and second liners down to the upper surface of the substrate by CMP. Further aspects include recessing the oxide to a depth of 200 Å to 500 Å.

Another aspect of the present disclosure is a device including a silicon (Si) substrate; and silicon fins formed on the Si substrate, each pair of adjacent fins having a first or second trench formed therebetween, the first trenches alternating with the second trenches, the second trenches having a larger depth into the Si substrate than the first trenches, and the first and second trenches being filled with an oxide. Aspects include etching the depth of the second trenches into the Si substrate 1000 Å to 2000 Å deeper than the depth of the first trenches in the Si substrate. Other aspects include filling the first and second trenches with the oxide including a HARP material.

Another aspect of the present disclosure is a method including: forming pillars on a nitride layer, the pillars including TEOS on poly-Si; conformally depositing a first TEOS liner over the entire silicon substrate; etching the first TEOS liner, the nitride layer, an oxide layer, and Si substrate through the pillars, forming first trenches; filling the first trenches and spaces between the pillars with a HARP material; CMP down to an upper surface of the poly-Si layer; removing the poly-Si layer; conformally depositing a second TEOS liner over the entire Si substrate; etching the second TEOS liner and Si between the HARP material, forming second trenches having a depth 1000 Å to 2000 Å larger or smaller than the first trenches; filling the second trenches with a HARP material; CMP down to an upper surface of the nitride layer; removing the nitride layer; forming a photoresist over the substrate, the photoresist having an opening over a plurality of the first and second trenches; etching a third trench in the Si substrate through the opening; removing the photoresist; filling the third trench with a HARP material; CMP down to an upper surface of the Si substrate; and recessing the HARP below the upper surface of the Si substrate to a depth of 200 Å to 500 Å.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3 through 33 schematically illustrate sequential steps of a method in accordance with an exemplary embodiment of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of inadequate alignment and/or registration structures in a FinFET for aligning the FinFET with a stepper or scanner. Alignment structures for aligning with steppers/scanners are hard to obtain because the conventional FinFET process leaves behind either a "sea-of-fins" or a deep trench. As a result, there are no large areas with different silicon heights, which is required for the stepper/scanner to recognize features for alignment purposes. In accordance with exemplary embodiments, a double trench flow is employed to obtain trenches with different depths, yielding a step difference in the silicon which can be recognized by a stepper for alignment.

Methodology in accordance with embodiments of the present disclosure includes forming pillars on an Si substrate, the pillars including TEOS on poly-Si; conformally depositing a first TEOS liner over the entire silicon substrate; etching the first TEOS liner and Si substrate through the pillars, forming first trenches; filling the first trenches and spaces between the pillars with an oxide; removing the TEOS from the pillars and the oxide therebetween; removing the poly-Si; conformally depositing a second TEOS liner over the entire Si substrate; etching the second TEOS liner and Si between the oxide, forming second trenches having a larger depth than the first trenches; filling the second trenches with oxide; removing the oxide and the first and second TEOS liners down to an upper surface of the Si substrate; and recessing the oxide below the upper surface of the Si substrate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
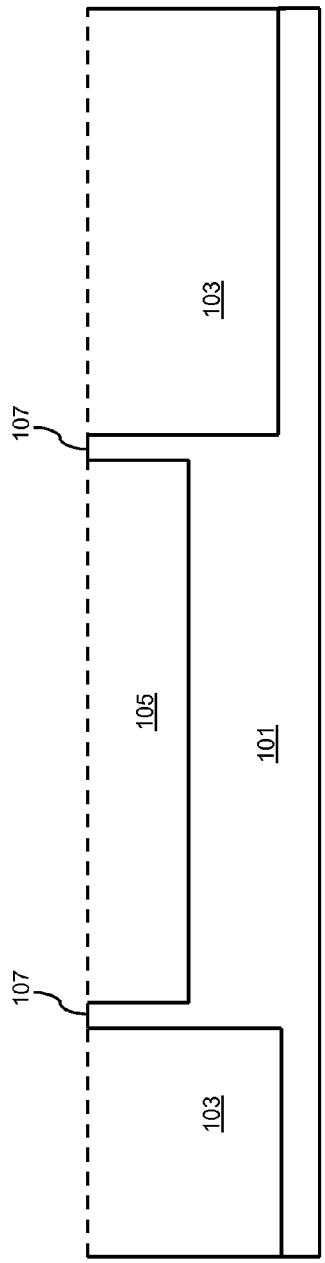
FIG. 1 schematically illustrates a cross section of a silicon substrate depicting a depth differential between first and second trenches, in accordance with an exemplary embodiment.

FIG. 1 illustrates a partial cross section of a silicon substrate 101 depicting two deep trenches 103 formed by dry etching the silicon substrate 101 to a depth of 2000 Å to 5000 Å, e.g., 4000 Å. The deep trenches 103 are separated by a shallow trench 105, which is formed by dry etching the silicon substrate 101 to a depth of 1000 Å to 4000 Å, e.g., 2000 Å. As a result, the silicon fins 107 are formed in between the deep trenches 103 and the shallow trench 105, and the depth differential between the bottom of the shallow trench 105 and the bottoms of the deep trenches 103 is 1000 Å to 2000 Å.

Figure 2:
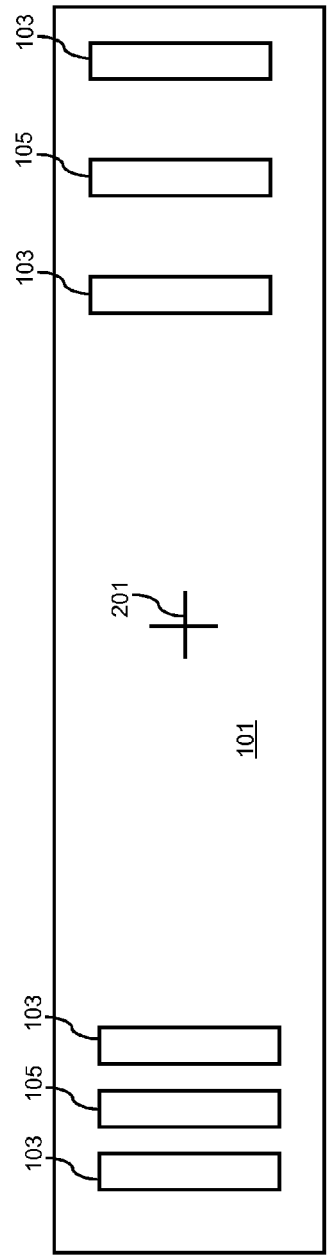
FIG. 2 schematically illustrates a plan view of a device including a silicon substrate and first and second trenches having a depth differential, in accordance with an exemplary embodiment.

FIG. 2 illustrates a partial plan view of the silicon substrate 101 depicting two groups of trenches, each including a shallow trench 105 surrounded by deep trenches 103. As further illustrated in FIG. 2, a cross 201 between the two groups of trenches has an area and is of the same type as the parallel trenches 103 and 105. FIG. 2 may alternatively include a number of variations not shown for illustrative purposes. For example, the trenches 103 and 105 may all be trenches of type 103 or may all be trenches of type 105, with the surrounding area being the silicon substrate 101, or the area indicated as 103 and 105 may be silicon substrate with the surrounding area being trenches of type 103 or of type 105. Alternatively, when the whole wafer does not have a planar original surface but an alignment feature is needed, the trenches 103 and 105 may all be trenches of the type 103 with the surrounding area being trench 105, wherein the drawn line between the areas is the fins 107, or the trenches 103 and 105 may all be trenches of type 105 with the surrounding area being trench 103, wherein the drawn line between the areas is the fins 107.

Figure 3:
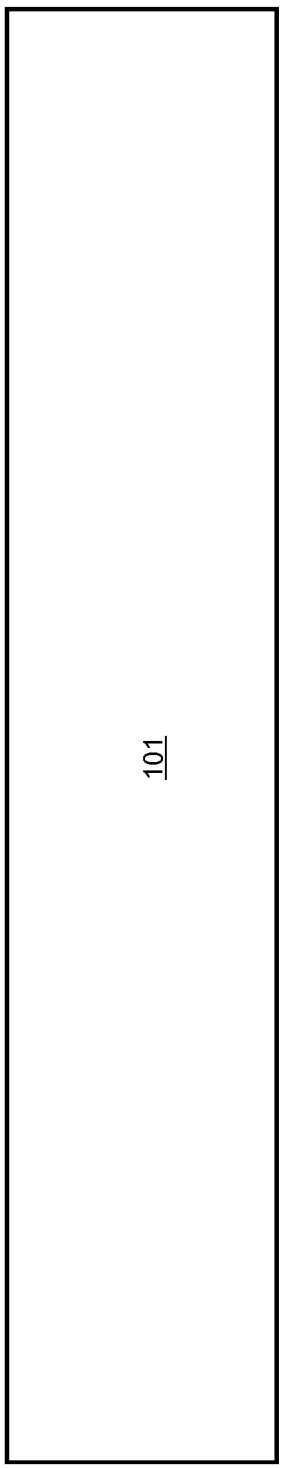
Figure 4:
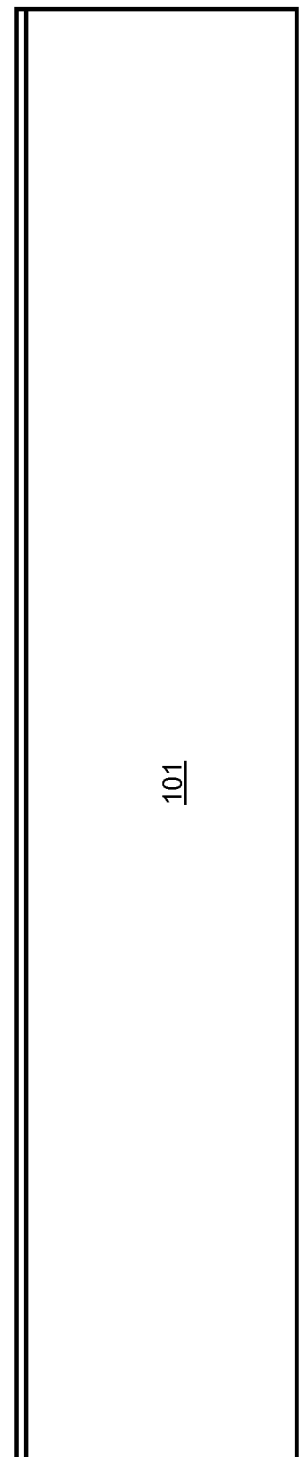

Adverting to FIG. 3, the starting material for generating the FinFET alignment structures using a double trench process flow is a silicon substrate 101. A pad oxide, oxide layer 401, is formed, e.g., thermally grown, on an upper surface of the silicon substrate 101 to a thickness of 35 Å to 300 Å, as illustrated in FIG. 4. Adverting to FIG. 5, a pad nitride, nitride layer 501, e.g., a high temperature nitride, is grown at 760° C., to a thickness of 50 Å on an upper surface of the oxide layer 401. The thickness of nitride layer 501 is limited to insure that the layer is formed as a continuous film. Next, a poly-Si layer 601 is grown, to a thickness of 500 Å to 2000 Å on a upper surface of the nitride layer 501, as illustrated in FIG. 6. Adverting to FIG. 7, a layer of TEOS 701 is grown to a thickness of 300 Å to 2000 Å on an upper surface of the poly-Si layer 601. A layer of OLP 801 is then formed grown to a thickness of 300 Å to 5000 Å on an upper surface of the TEOS layer 701. OLP 801 not only planarizes the surface, but also reduces optical reflections from underlying layers and avoids reflection of light during subsequent exposure, which could cause undesirable critical dimension changes.

Figure 9:
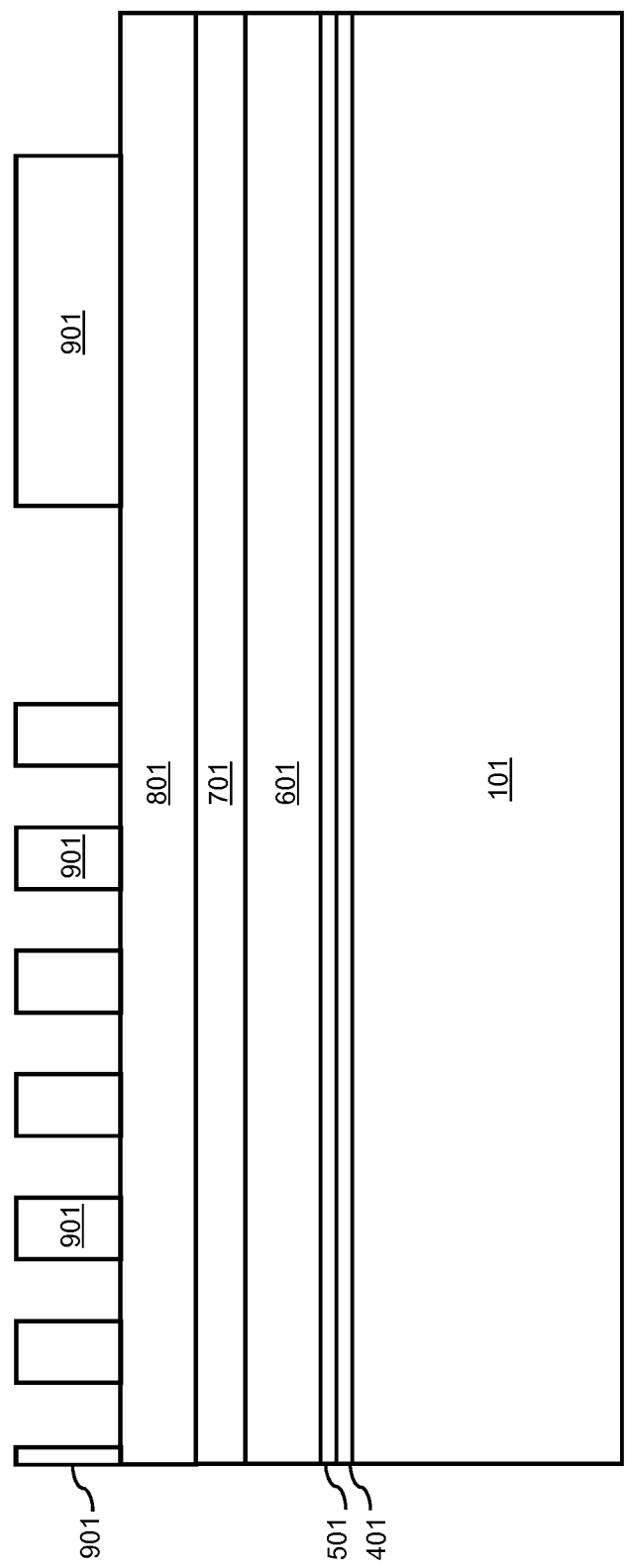

Once the poly-Si layer 601, the TEOS layer 701, and the OLP layer 801 are formed, a patterned photomask 901 is formed on an upper surface of the OLP layer 801, as illustrated in FIG. 9. In particular, the photomask 901 includes 99% smaller elements which will help create a "sea-of-fins" and 1% larger features that provide alignment features for the scanner/stepper. The width of the larger photomask features is 8 micrometers (um) to 8.8 um. Alternatively, the larger photomask features may be reduced to 4 um to 4.4 um wide.

Figure 10:
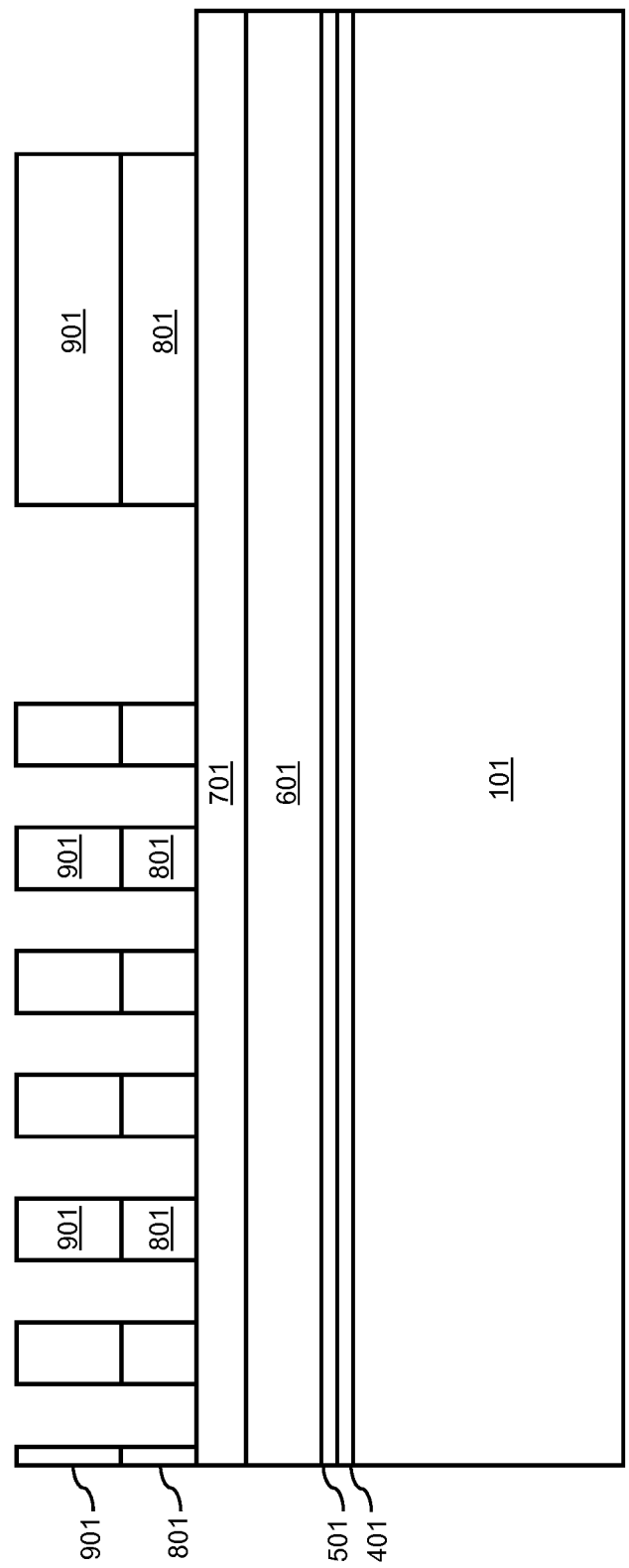
Figure 11:
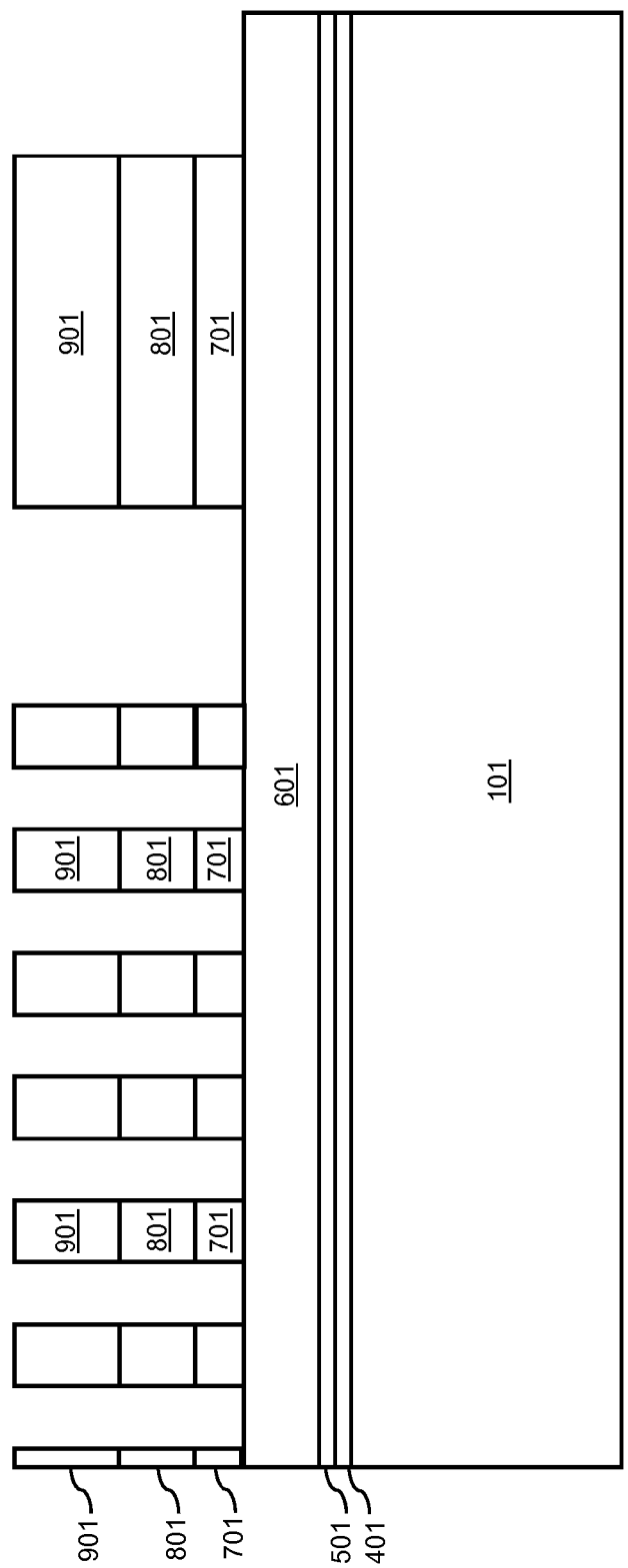
Figure 12:
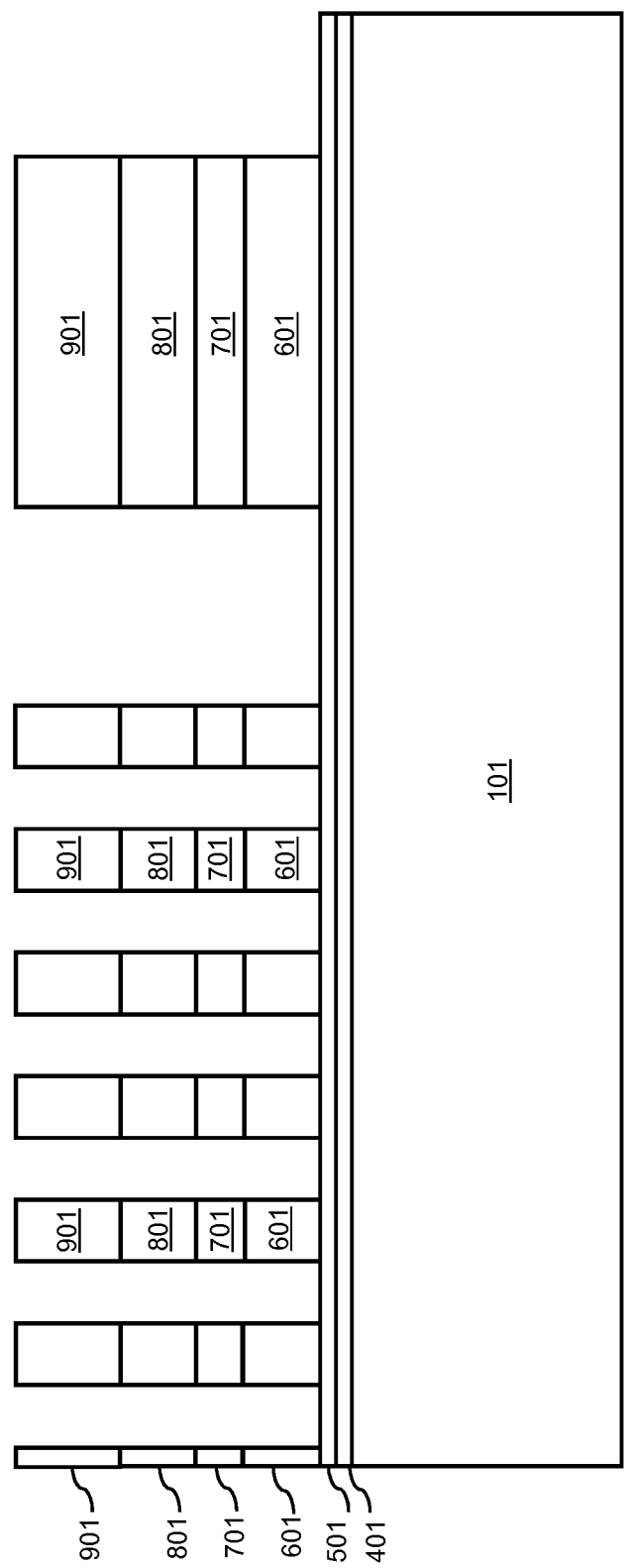
Figure 13:
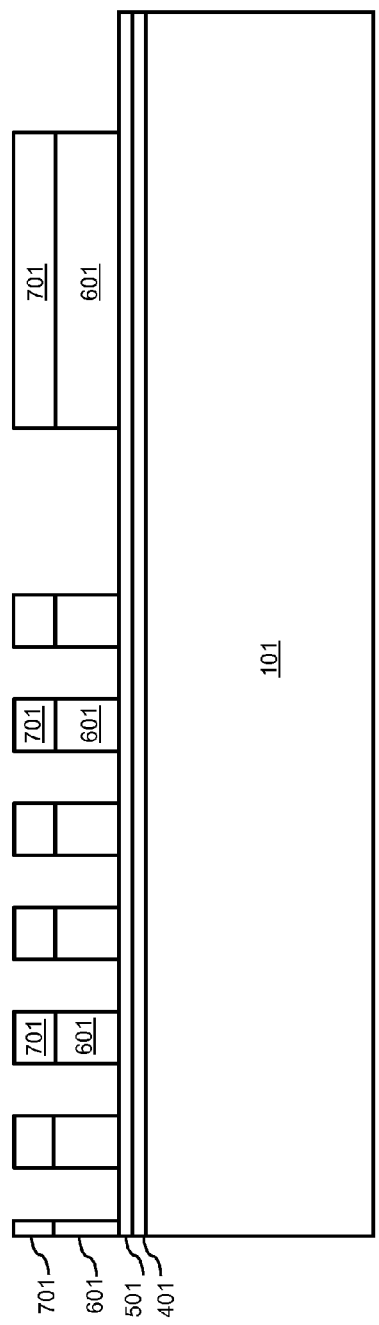

Adverting to FIGS. 10 through 12, the OLP layer 801, the TEOS layer 701, and the poly-Si layer 601 are dry etched, respectively, one layer at a time, very selectively to the underlying layer and stopping on the nitride layer 501. As a result, vertical slopes may be obtained. Further, an over etch may be applied to avoid "stringers" and defects. Once the OLP layer 801, the TEOS layer 701, and the poly-Si layer 601 have been etched, the photomask 901 and the OLP layer 801 are stripped, leaving pillars including the TEOS layer 701 and the poly-Si layer 601, as illustrated in FIG. 13.

Figure 14:
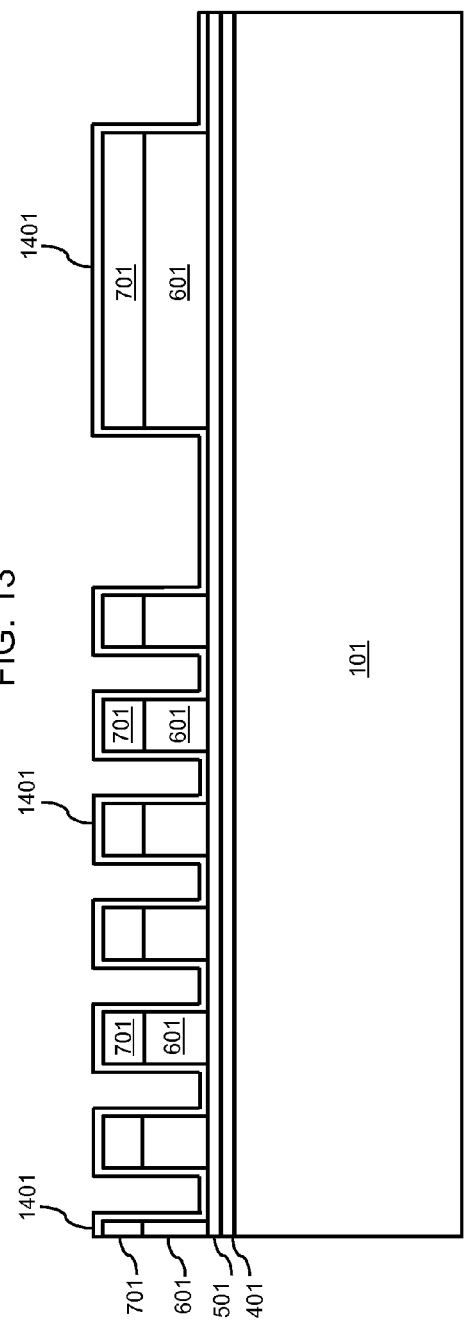

Adverting to FIG. 14, a layer of TEOS is conformally deposited to a thickness of 0 Å to the fin width, e.g. 60 Å, over the pillars and the nitride layer 501 to form a TEOS liner 1401. The TEOS liner 1401 sets the lateral width of a spacer (formed from the TEOS) that will later set part of the width of the silicon fin. A sum of the first TEOS spacer and a second TEOS spacer, described later, determines the final width of the silicon fin. The choice of width for the TEOS spacers can fine tune the exact position of the spacers and can compensate for photo bias.

Figure 15:
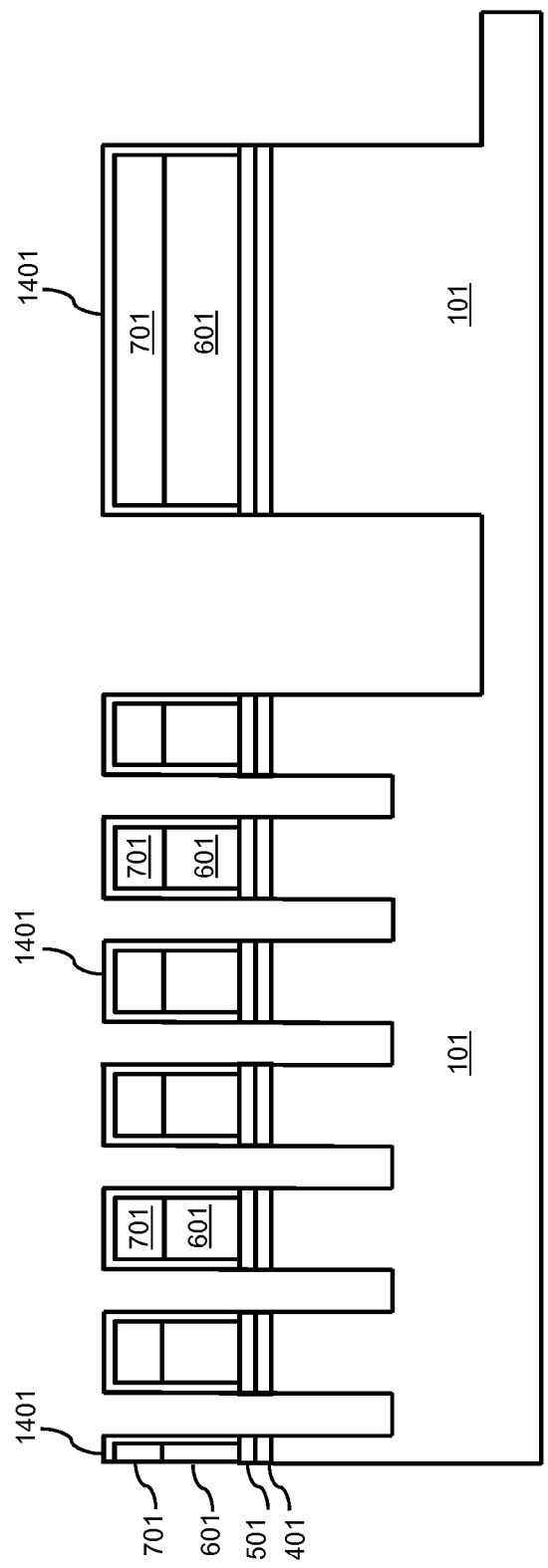
Figure 16:
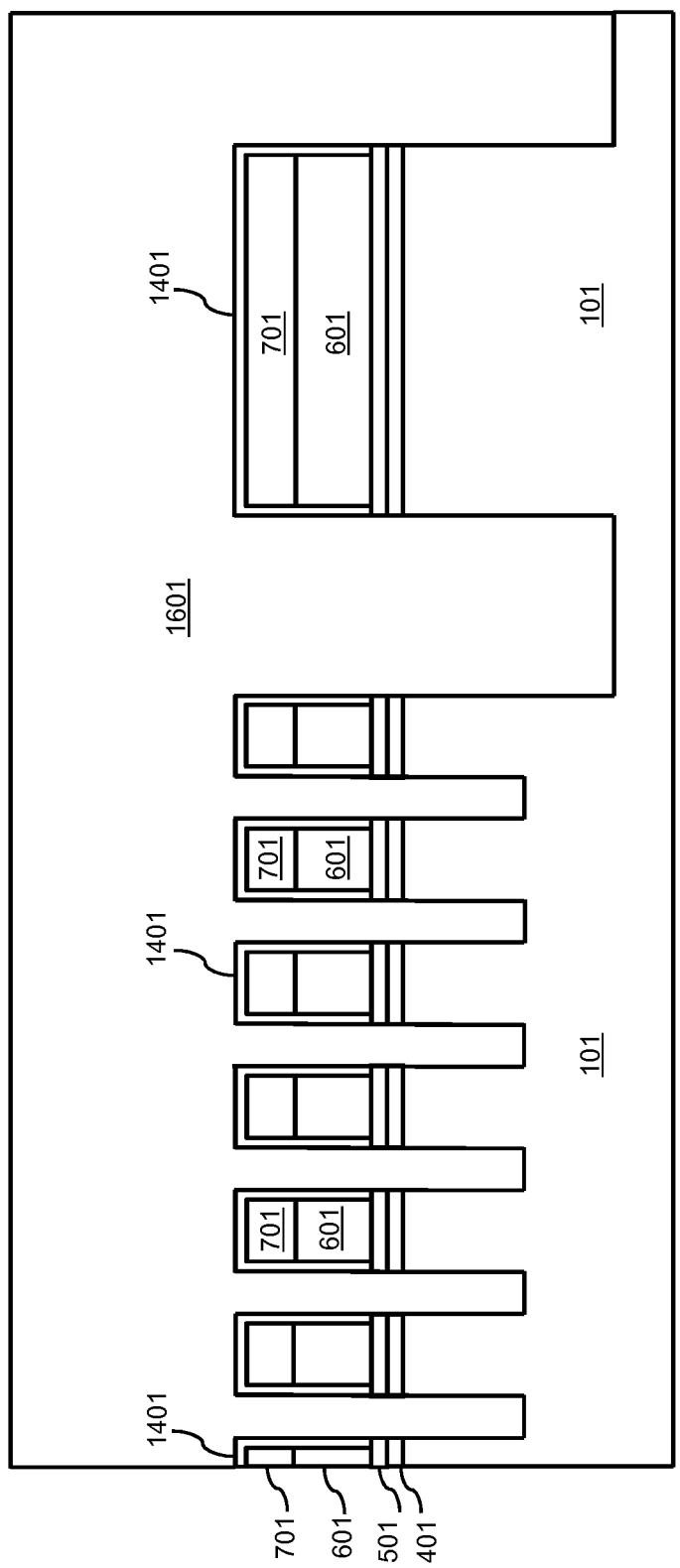

As illustrated in FIG. 15, shallow trenches are formed by dry etching the TEOS liner 1401, the nitride layer 501, the oxide layer 401, and the Si substrate 101 to a depth of 1000 Å to 4000 Å, e.g., 2000 Å, into the Si substrate 101. Dry etching the Si in between the pillars yields vertical slopes for the Si. The shallow trenches are then filled with a layer of HARP material 1601, e.g., a plasma enriched oxide fill, as illustrated in FIG. 16.

Figure 17:
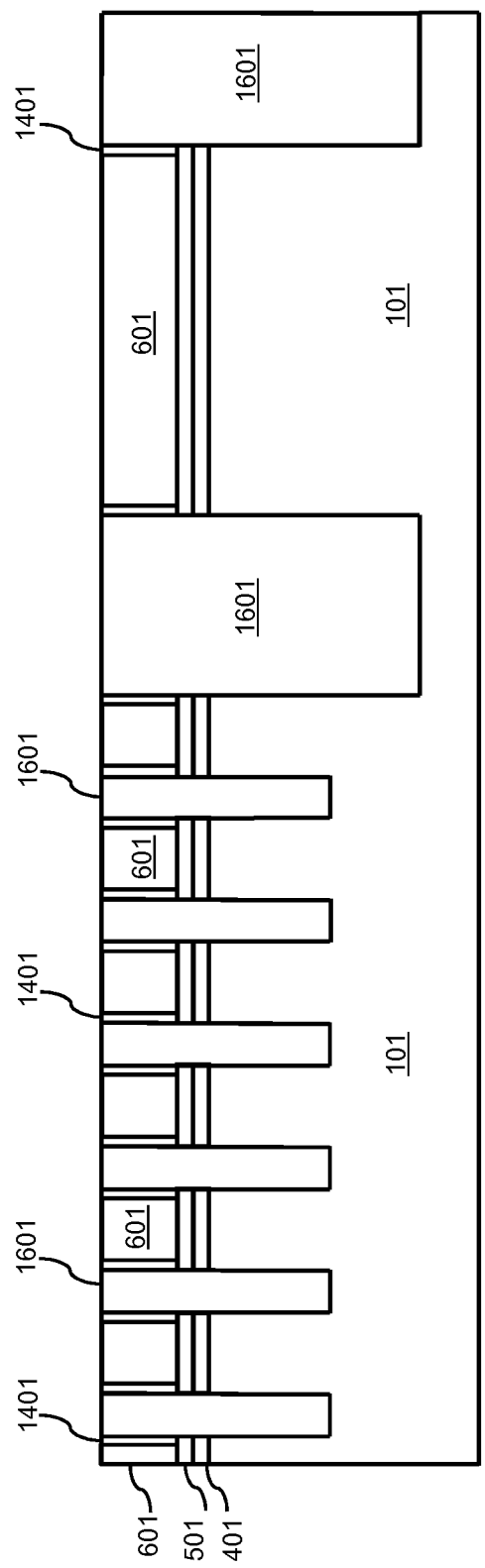
Figure 18:
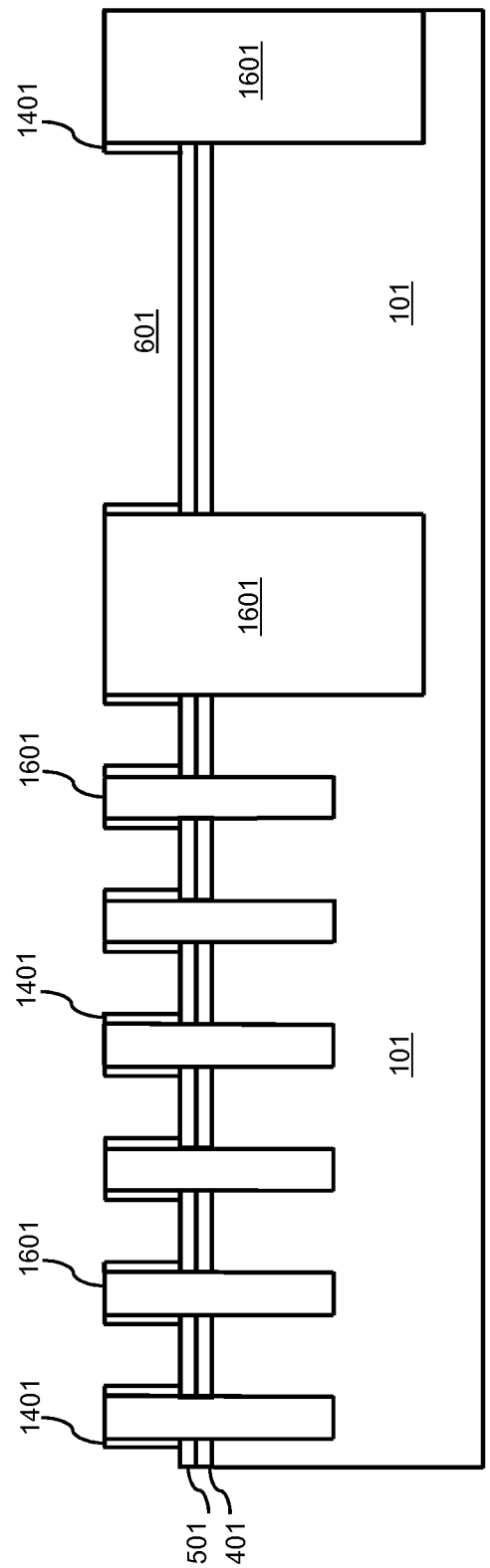

Adverting to FIG. 17, CMP is performed on the HARP layer 1601, stopping on the poly-Si layer 601. The TEOS liner 1401 on the upper surface of the TEOS layer 701 and the TEOS layer 701 are also removed. TEOS layer 1401 now forms TEOS spacers on opposite sides of HARP layer 1601. Next, the poly-Si layer 601 is removed, for example by wet etching selectively against the nitride layer 501 and the oxide layer 401, e.g., by using tetramethylammonium hydroxide (TMAH), as illustrated in FIG. 18.

Figure 19:
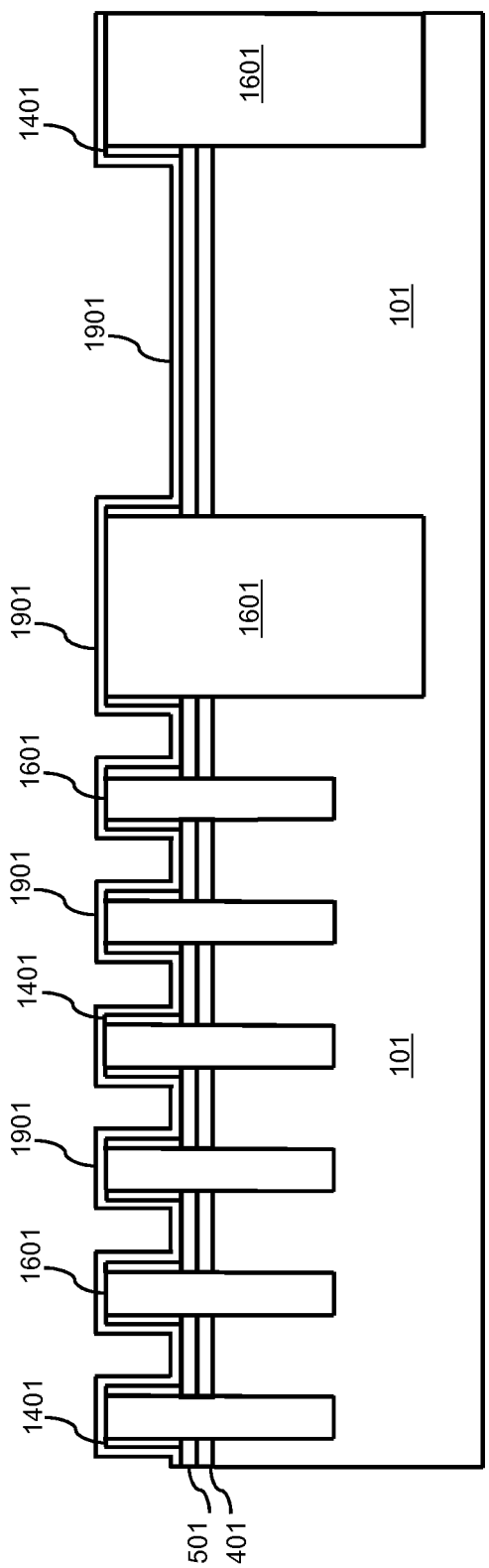
Figure 20:
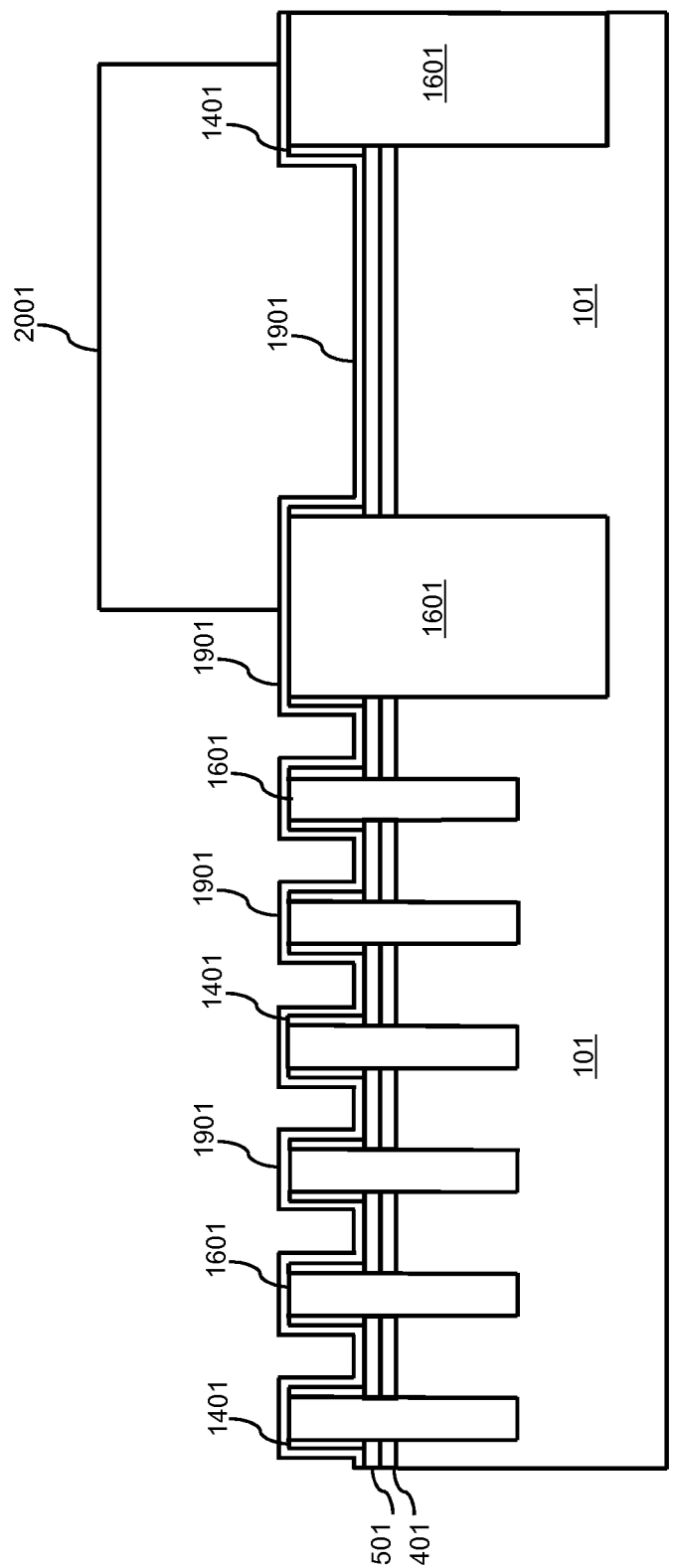

Adverting to FIG. 19, a third layer of TEOS is conformally deposited to a thickness of 0 Å (only if the thickness of TEOS liner 1401 is greater than 0 Å) to the fin width, e.g. 60 Å, on a upper surface of the HARP layer 1601, the nitride layer 501, and the remaining portion of the TEOS liner 1401, forming the TEOS liner 1901. As previously discussed, the TEOS liners 1401 and 1901 determine the final width of the silicon fins in the FinFET flow. As illustrated in FIG. 20, a photomask 2001 is formed on a portion of the TEOS liner 1901 to cover areas that are not to be trench etched. As a result, the surface under the photomask 2001 will remain at the original height of the upper surface of the Si substrate 101.

Figure 21:
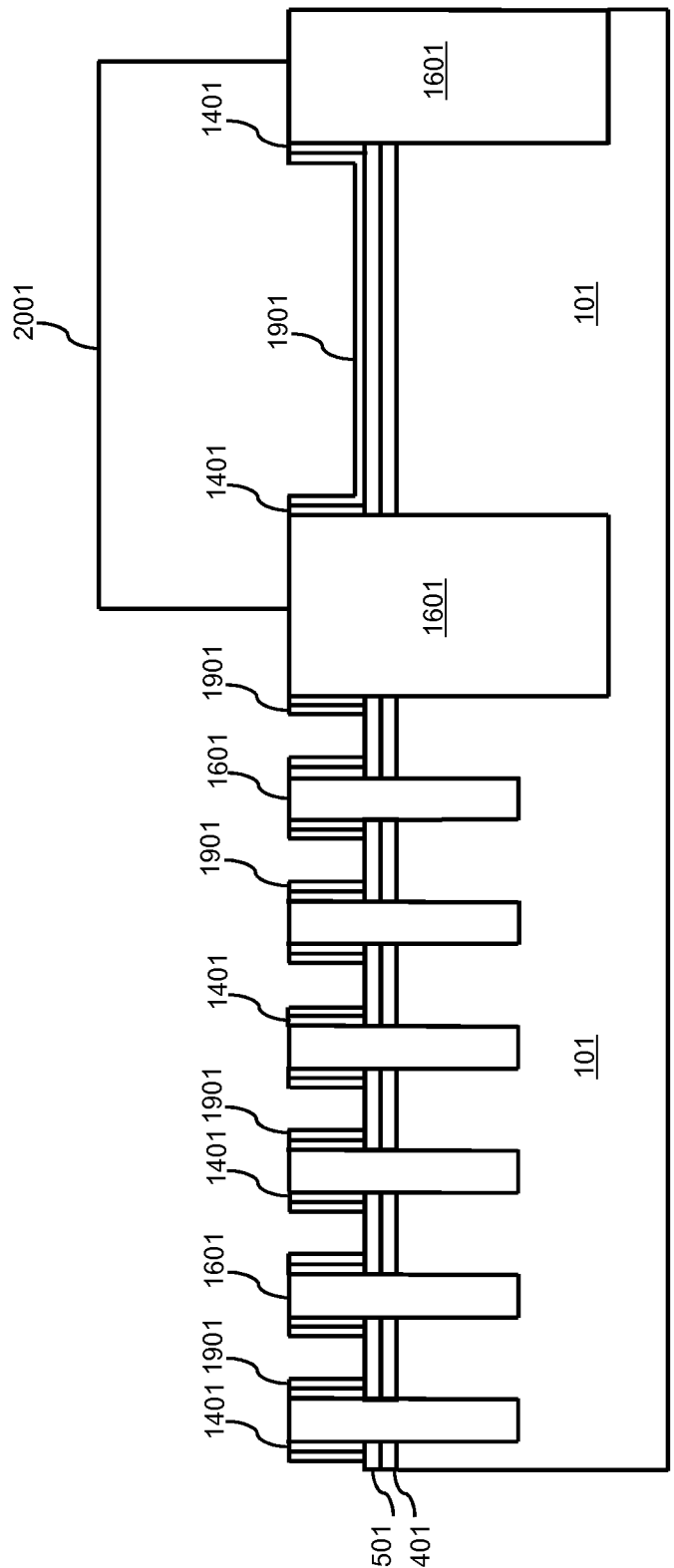
Figure 22:
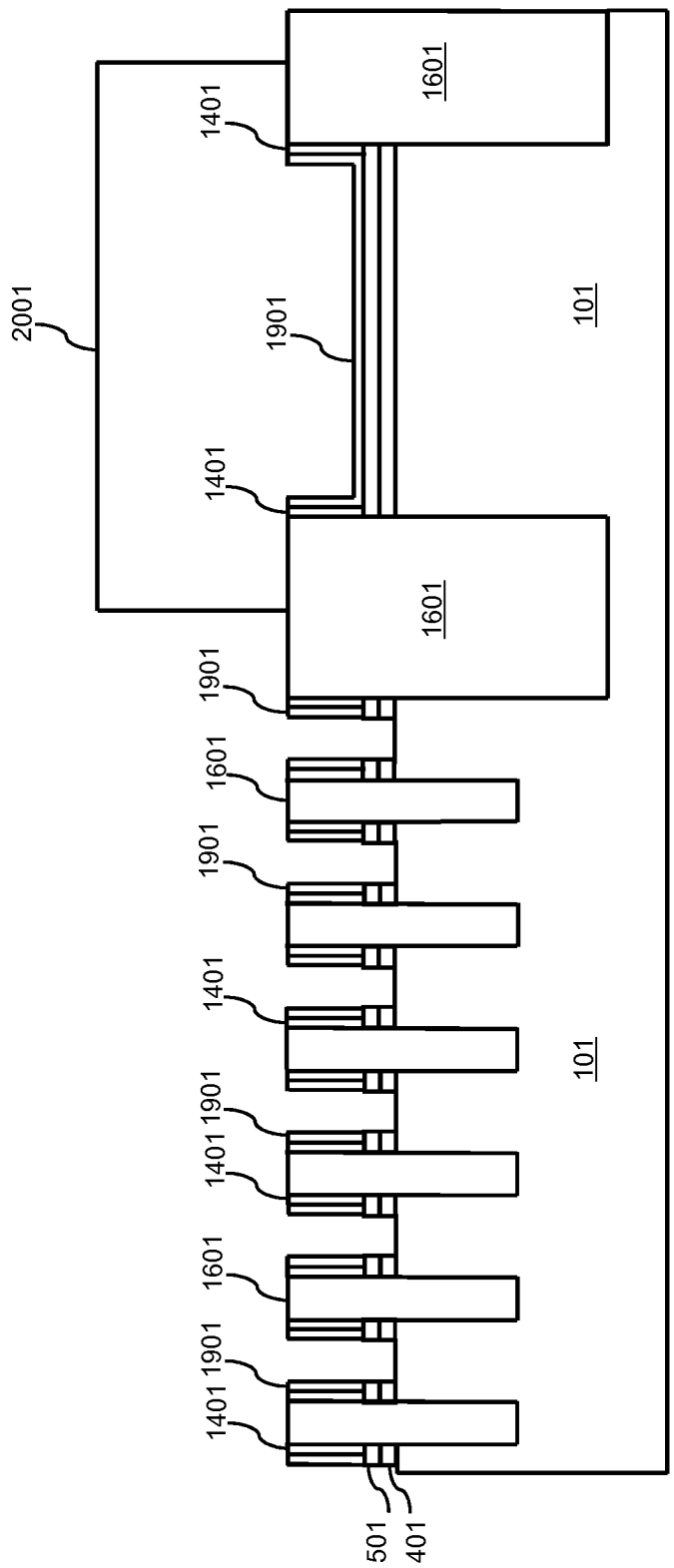

As illustrated in FIG. 21, the TEOS liner 1901 is etched selectively against the underlying HARP layer 1601 and nitride layer 501. More specifically, the TEOS liner 1901 may be etched using an oxide etchant, e.g., fluoroform ($CHF_3$), tetrafluoromethane ($CF_4$), hexafluorethane ($C_2F_6$), etc. The remaining TEOS liner 1901 forms second spacers, which together with TEOS liner 1401 spacers define the position and width of the later formed fins. Adverting to FIG. 22, the nitride layer 501 and oxide layer 401 between the TEOS liner 1901 spacers are trench etched selectively against the Si substrate 101.

Figure 23:
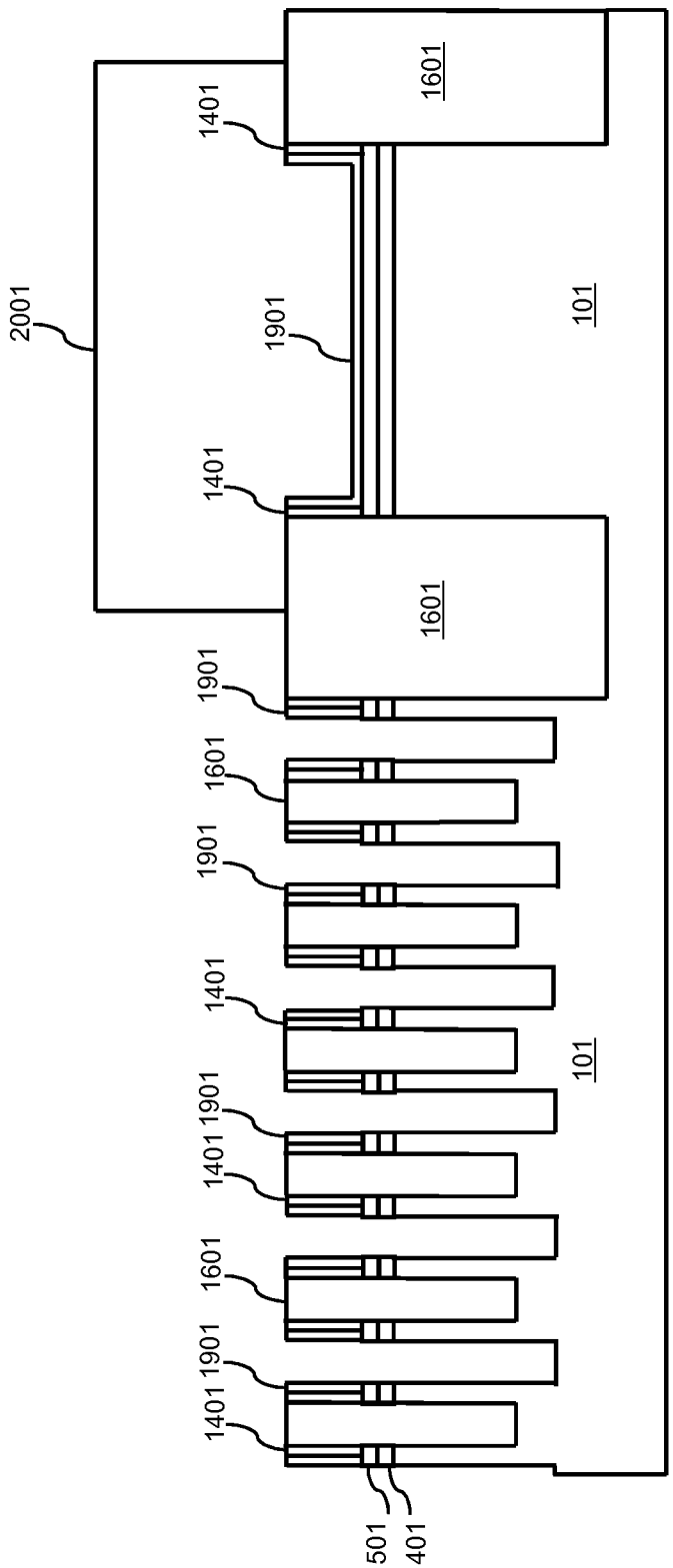

Adverting to FIG. 23 deep trenches are formed in the Si substrate 101 by dry etching the Si substrate 101 to a depth of 2000 Å to 5000 Å, e.g., 4000 Å. The depth of the deep trenches must be at least 1000 Å greater than the depth of the shallow trenches, for example 1400 Å to 2500 Å greater. Although the first formed trenches were described as shallow trenches and the second formed trenches were described as deep trenches, the deep trenches may be formed prior to the shallow trenches. Portions of silicon substrate remaining between the shallow and deep trenches form silicon fins.

Figure 24:
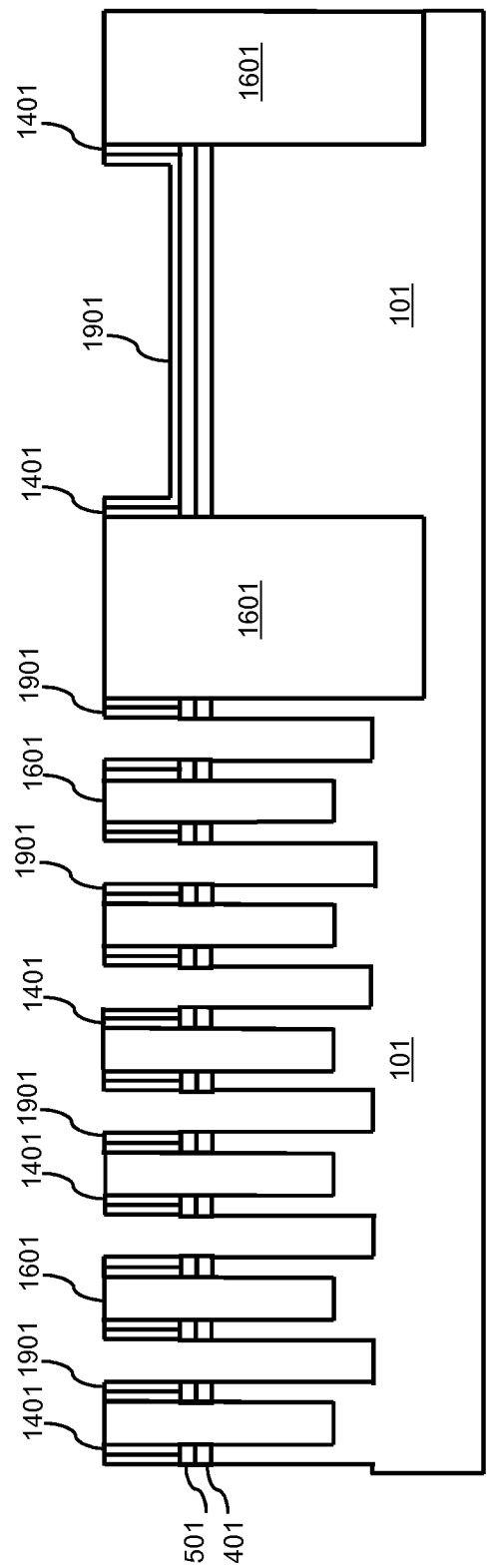

Once the deep trenches are etched in the Si substrate 101, the photomask 2001 is stripped off, as illustrated in FIG. 24. Alternatively, the photomask 2001 is stripped prior to forming the deep trenches. In this case, the Si substrate 101 is etched selectively against the nitride layer 501 and the oxide layer 401, which avoids having a photo resist on the wafer while etching the deep trenches and also avoids possible contamination by photo resist residues.

Figure 25:
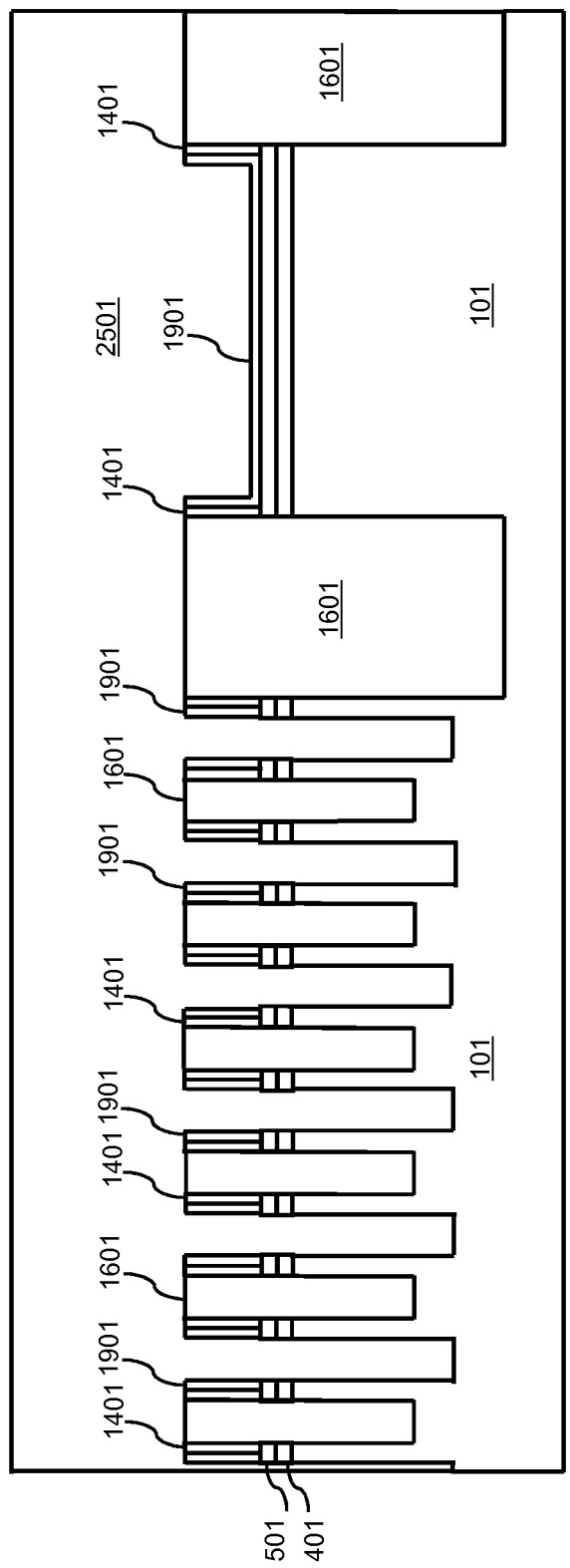
Figure 26:
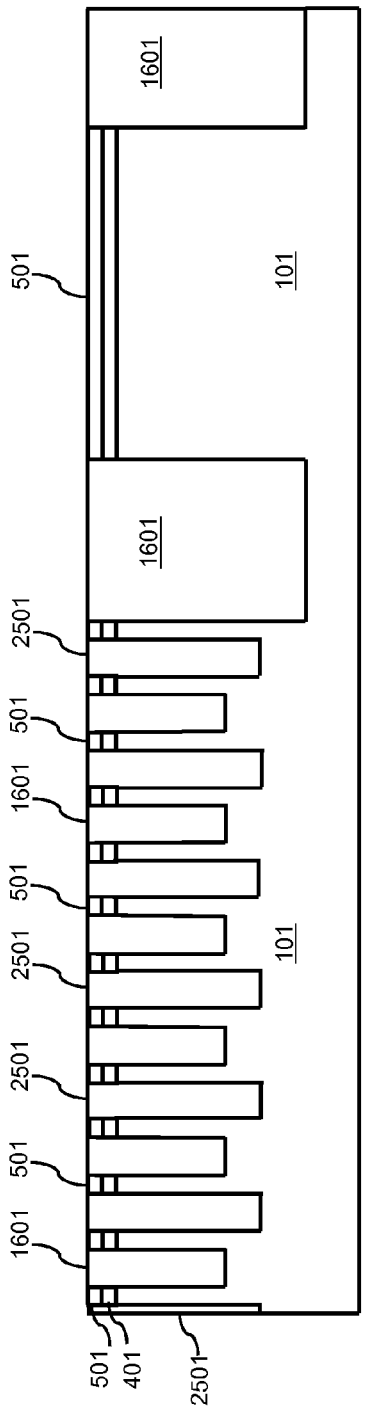
Figure 27:
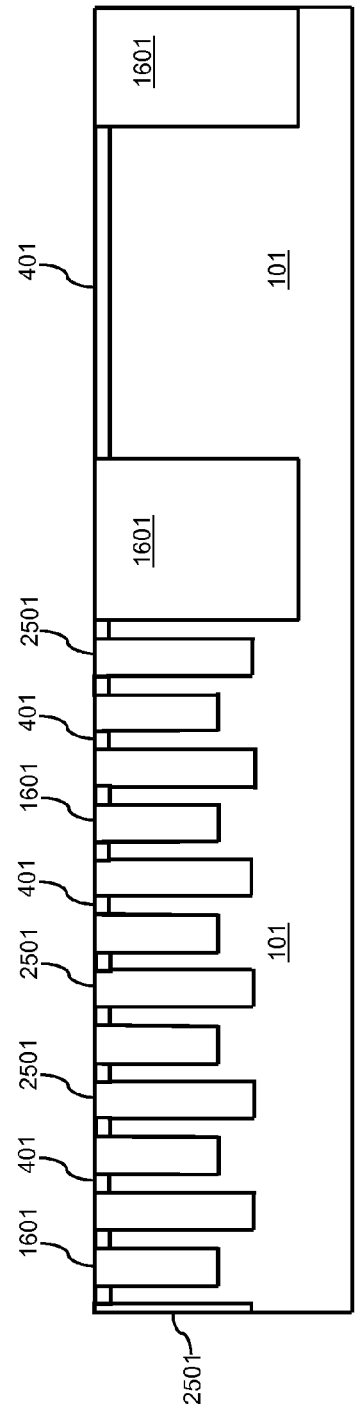

As illustrated in FIG. 25, the deep trenches and the area previously covered by the photomask 2001 are filled with a layer of HARP material 2501, e.g., a plasma enriched oxide fill. Adverting to FIG. 26, CMP is then performed to planarize the HARP layer 2501, the HARP layer 1601, and the TEOS liners 1401 and 1901 down to the nitride layer 501. The nitride layer 501 may then be removed from the wafer using a wet strip process, e.g., using $CF_4$, as illustrated in FIG. 27.

Figure 28:
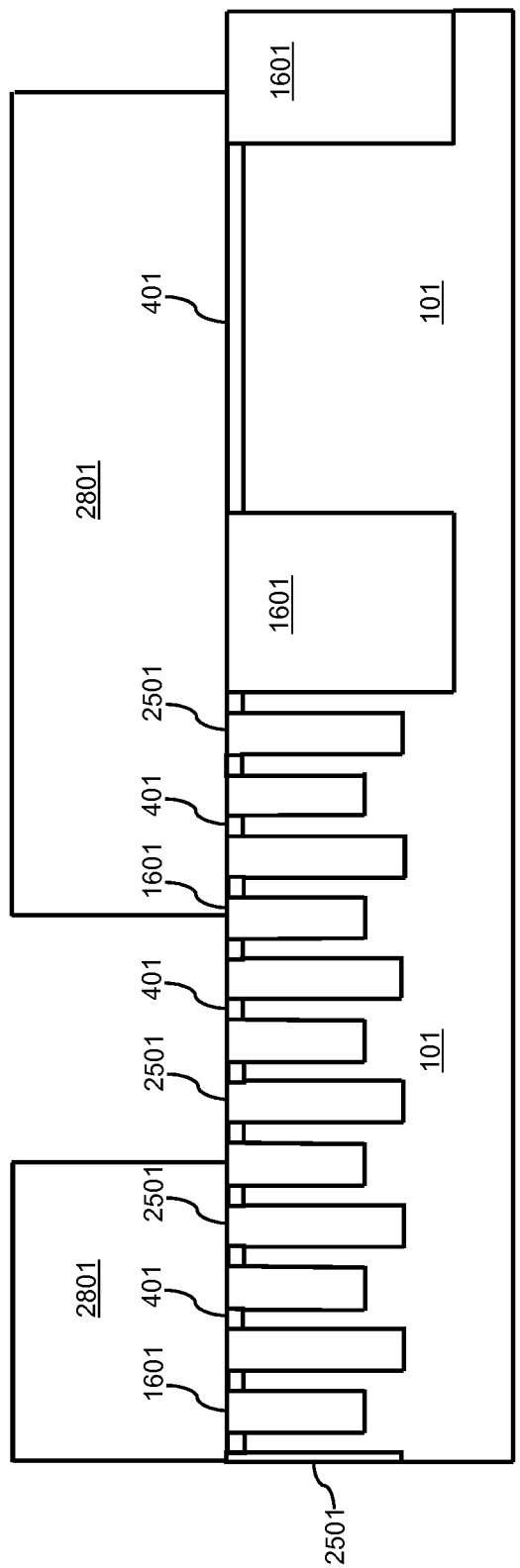

Adverting to FIG. 28, a photomask 2801 may be formed on portions of the wafer to expose the silicon fins of the Si substrate 101 that are not needed for the electrical circuit and/or the fins that need to be removed for other reasons, e.g., gate contacts. As illustrated in FIG. 29, a third trench is formed in the Si substrate 101 in between portions of the photomask 2801 by etching portions of the oxide layer 401, the HARP layers 1601 and 2501, and the Si substrate 101 to a depth of 1500 Å to 5000 Å or deeper using $CF_4$, for example. The specific depth of the third trench depends on the application of the device and how it is integrated. By way of example, if the third trench only removes fins for N+ to N+ isolation, then a trench depth of 1500 Å is sufficient. However, if the third trench is intended to isolate an N-well from a P-well then a trench depth of 2500 Å to 3000 Å is needed. In other words, the depth of the third trench may be the same as the depth of either the first or second trenches, may be smaller than both depths, or may be larger than both depths, depending on the particular application. In addition, the third trench may be narrow or wide (though a wide trench may be difficult to fill) or may be an array of narrow trenches, depending on the particular application.

Figure 31:
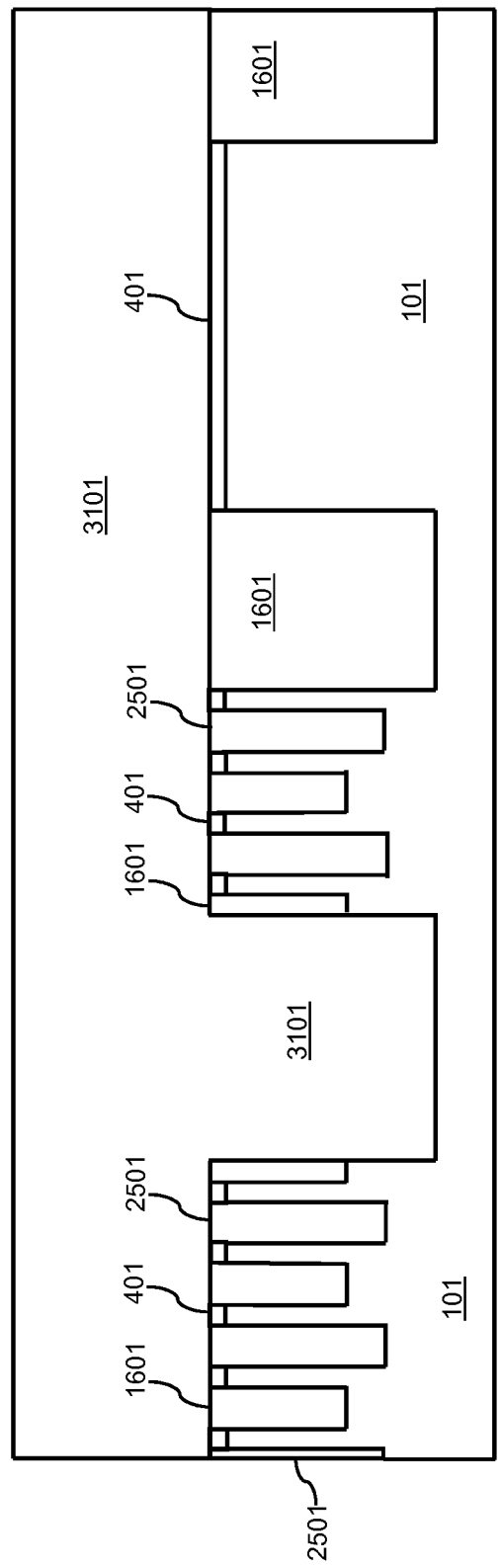
Figure 32:
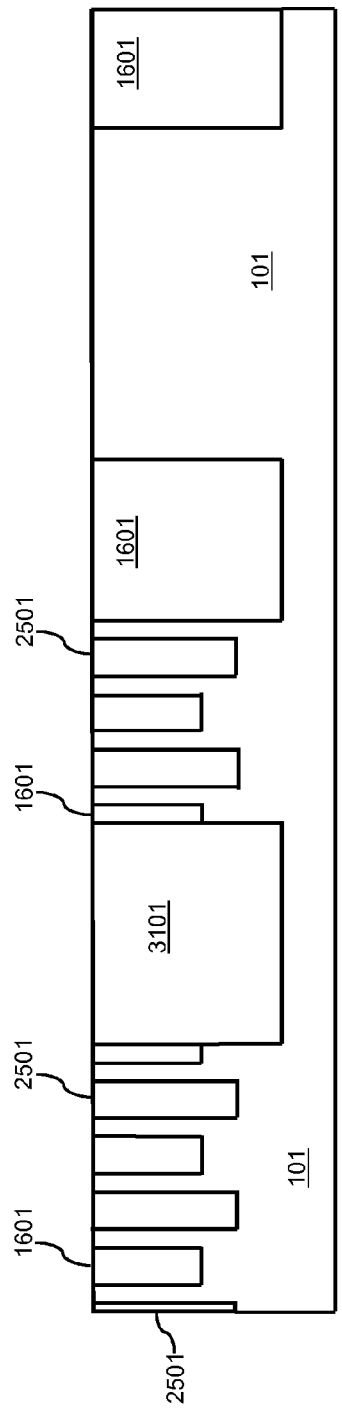

Subsequently, the photomask 2801 is removed from the wafer, as illustrated in FIG. 30. Adverting to FIG. 31, a layer of HARP material 3101, e.g., a plasma enriched oxide fill, is formed in the third trench and over the entire surface of the wafer. As illustrated in FIG. 32, CMP is performed, stopping on the Si substrate 101. The CMP removes the HARP layer 3101 from above the substrate 101, as well as the remaining portions of the oxide layer 401 and provides the self-aligned fin recess.

Figure 33:
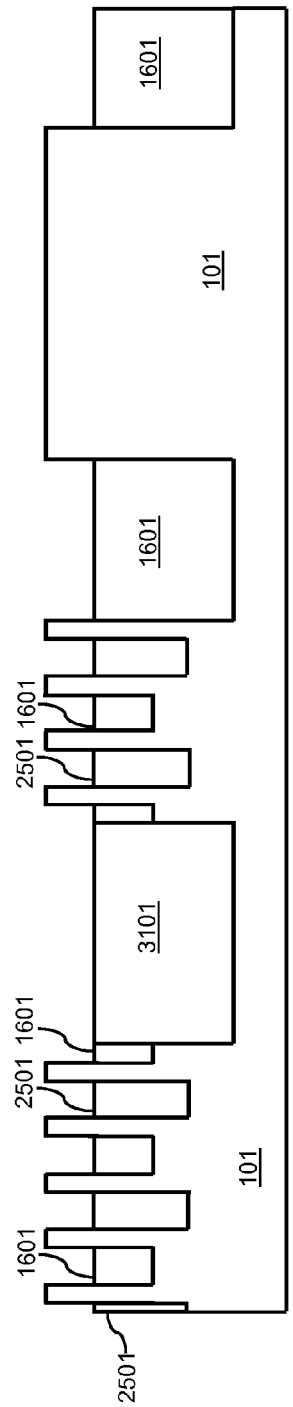

Adverting to FIG. 33, the HARP layers 1601, 2501, and 3101 are recessed to a depth of 200 Å to 500 Å to obtain the electrical width of the silicon fin of the Si substrate 101. In particular, the recess has to be uniform as this determines the effective width of the transistor and sets the current drive.

The embodiments of the present disclosure can achieve several technical effects including producing stepper/scanner alignment features on silicon wafers by forming different silicon depths using a double trench FinFET flow. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices including FinFETs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming pillars on a silicon (Si) substrate, the pillars comprising tetraethyl orthosilicate (TEOS) on polysilicon (poly-Si);
   conformally depositing a first TEOS liner over the entire silicon substrate;
   etching the first TEOS liner and Si substrate through the pillars,
   forming first trenches;
   filling the first trenches and spaces between the pillars with an oxide;
   removing the TEOS from the pillars and the oxide therebetween;
   removing the poly-Si;
   conformally depositing a second TEOS liner over the entire Si substrate;
   etching the second TEOS liner and Si between the oxide, forming second trenches having a different depth than the first trenches;
   filling the second trenches with oxide;
   removing the oxide and the first and second TEOS liners down to an upper surface of the Si substrate; and
   recessing the oxide below the upper surface of the Si substrate.

2. The method according to claim 1, further comprising forming an oxide layer and a nitride layer on the Si substrate prior to forming the pillars.

3. The method according to claim 2, comprising:
   forming the oxide layer to a thickness of 35 angstroms (Å) to 300 Å; and
   forming the nitride layer to a thickness of about 50 Å.

4. The method according to claim 1, comprising forming the pillars by:
   sequentially forming a poly-Si layer, a TEOS layer, and a one layer planarization (OLP) layer on the Si substrate;
   forming a photomask on the OLP layer;
   sequentially etching the OLP layer, the TEOS layer, and the poly-Si through the photomask; and
   removing the photomask and OLP layer.

5. The method according to claim 4, comprising:
   forming the poly-Si layer to a thickness of 500 Å to 2000 Å;
   forming the TEOS layer to a thickness of 300 Å to 2000 Å; and
   forming the OLP layer to a thickness of 300 Å to 2000 Å.

6. The method according to claim 4, comprising etching the OLP layer, the TEOS layer, and the poly-Si layer by dry-etching.

7. The method according to claim 1, comprising depositing the first TEOS liner to a thickness of 30 Å to 600 Å.

8. The method according to claim 1, comprising etching the first TEOS liner and the Si by dry etching.

9. The method according to claim 8, comprising dry etching to a depth of 1000 Å to 5000 Å into the Si substrate.

10. The method according to claim 1, comprising filling the first and second trenches with a high aspect ratio process (HARP) material.

11. The method according to claim 1, comprising removing the TEOS from the pillars and the oxide therebetween by chemical mechanical polishing (CMP).

12. The method according to claim 1, removing the poly-Si by wet etching.

13. The method according to claim 1, comprising depositing the second TEOS liner to a thickness of 30 Å to 600 Å.

14. The method according to claim 1, comprising etching the second TEOS liner and the Si by dry etching to a depth of 1000 Å to 5000 Å into the Si substrate.

15. The method according to claim 1, comprising removing the oxide and the first and second liners down to the upper surface of the substrate by CMP.

16. The method according to claim 1, comprising recessing the oxide to a depth of 200 Å to 500 Å.

17. A method comprising:
   forming pillars on a nitride layer, the pillars comprising tetraethyl orthosilicate (TEOS) on polysilicon (poly-Si);
   conformally depositing a first TEOS liner over the entire silicon substrate;
   etching the first TEOS liner, the nitride layer, an oxide layer, and Si substrate through the pillars, forming first trenches;
   filling the first trenches and spaces between the pillars with a high aspect ratio process (HARP) material;
   chemical mechanical polishing (CMP) down to an upper surface of the poly-Si layer;
   removing the poly-Si layer;
   conformally depositing a second TEOS liner over the entire Si substrate;
   etching the second TEOS liner and Si between the HARP material, forming second trenches having a depth 1000 Å to 2000 Å larger or smaller than the first trenches;
   filling the second trenches with a HARP material;
   CMP down to an upper surface of the nitride layer;
   removing the nitride layer;
   forming a photoresist over the substrate, the photoresist having an opening over a plurality of the first and second trenches;
   etching a third trench in the Si substrate through the opening;
   removing the photoresist;
   filling the third trench with a HARP material;
   CMP down to an upper surface of the Si substrate; and
   recessing the HARP below the upper surface of the Si substrate to a depth of 200 Å to 500 Å.

* * * * *